United States Patent
Lim et al.

(10) Patent No.: US 11,002,793 B2
(45) Date of Patent: May 11, 2021

(54) BATTERY MONITORING METHOD AND APPARATUS DETECTING CHARGE BALANCE OF BATTERY

(71) Applicant: SAMSUNG ELECTRONICS CO., LTD., Suwon-si (KR)

(72) Inventors: Ju Wan Lim, Suwon-si (KR); Duk Jin Oh, Seoul (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 322 days.

(21) Appl. No.: 15/981,709

(22) Filed: May 16, 2018

(65) Prior Publication Data

US 2019/0195956 A1 Jun. 27, 2019

(30) Foreign Application Priority Data

Dec. 21, 2017 (KR) ........................ 10-2017-0177478

(51) Int. Cl.
*G01R 31/367* (2019.01)
*G01R 31/392* (2019.01)
*G01R 31/388* (2019.01)

(52) U.S. Cl.
CPC ......... *G01R 31/367* (2019.01); *G01R 31/392* (2019.01)

(58) Field of Classification Search
CPC ............................ G01R 31/367; G01R 31/392
See application file for complete search history.

(56) References Cited

U.S. PATENT DOCUMENTS

| | | | |
|---|---|---|---|
| 8,054,038 B2 | 11/2011 | Kelty et al. | |
| 8,117,857 B2 | 2/2012 | Kelty et al. | |
| 8,508,191 B2 | 8/2013 | Kim et al. | |
| 8,532,945 B2 | 9/2013 | Sciarretta et al. | |
| 8,618,775 B2 | 12/2013 | Hermann et al. | |
| 8,624,560 B2 | 1/2014 | Ungar et al. | |
| 8,680,815 B2 * | 3/2014 | Wang ................... | G01R 31/392 320/132 |
| 8,860,815 B2 * | 10/2014 | Loos .................. | G06K 9/00771 348/169 |
| 8,961,203 B2 | 2/2015 | Lee | |
| 8,972,213 B2 | 3/2015 | Zhang et al. | |
| 9,197,089 B2 * | 11/2015 | Choe ..................... | H01M 10/48 |
| 9,728,992 B2 | 8/2017 | Takahashi | |
| 2010/0090650 A1 * | 4/2010 | Yazami ................ | G01R 31/382 320/132 |
| 2011/0060539 A1 | 3/2011 | Sciarretta et al. | |
| 2013/0088201 A1 * | 4/2013 | Iwasawa ............... | H02J 7/0019 320/118 |

(Continued)

FOREIGN PATENT DOCUMENTS

| | | | |
|---|---|---|---|
| CN | 105452890 A | | 3/2016 |
| CN | 107121642 | * | 9/2017 |

(Continued)

*Primary Examiner* — Catherine T. Rastovski
(74) *Attorney, Agent, or Firm* — NSIP Law

(57) ABSTRACT

A battery monitoring method includes identifying a state of charge (SOC) of a battery, obtaining a voltage of the battery with respect to the SOC, in response to the identified SOC being included in a diagnosis section, and determining a state of health (SOH) of the battery based on the obtained voltage of the battery.

18 Claims, 7 Drawing Sheets

(56) References Cited

U.S. PATENT DOCUMENTS

| | | | |
|---|---|---|---|
| 2015/0377976 A1* | 12/2015 | Maluf | G01R 31/392 |
| | | | 702/63 |
| 2016/0308375 A1 | 10/2016 | Pognant-Gros et al. | |
| 2017/0259687 A1* | 9/2017 | Chikkannanavar | B60L 58/12 |
| 2018/0203071 A1* | 7/2018 | Takemura | H01M 4/5825 |

FOREIGN PATENT DOCUMENTS

| | | |
|---|---|---|
| JP | 2004-257781 A | 9/2004 |
| JP | 5839052 B2 | 11/2015 |
| KR | 10-2016-0144437 A | 12/2016 |
| KR | 10-2017-0021630 A | 2/2017 |

* cited by examiner

BATTERY MONITORING METHOD AND APPARATUS DETECTING CHARGE BALANCE OF BATTERY

CROSS-REFERENCE TO RELATED APPLICATIONS

This application claims the benefit under 35 USC 119(a) of Korean Patent Application No. 10-2017-0177478 filed on Dec. 21, 2017 in the Korean Intellectual Property Office, the entire disclosure of which is incorporated herein by reference for all purposes.

BACKGROUND

1. Field

The following description relates to a method and battery management system (BMS) that manages the operation of a battery.

2. Description of Related Art

A battery is used as a mobile power source. For example, a battery is used as a power source of a mobile device or an electric vehicle. Various schemes of charging a battery have been suggested. Among the various schemes, a generally used scheme is constant current-constant voltage (CC-CV) charging that charges a battery with a constant current until a predetermined voltage is reached, and then charges the battery with a constant voltage until a preset low current is reached. In addition, multi-step charging that charges a battery with a constant current having multiple steps, while progressively reducing a magnitude of the current, and pulse charging that repeatedly applies a pulse current in a unit of a short time interval are also used.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery monitoring method includes identifying a state of charge (SOC) of a battery, obtaining a voltage of the battery with respect to the SOC, in response to the identified SOC being included in a diagnosis section, and determining a state of health (SOH) of the battery based on the obtained voltage of the battery.

The obtaining may include measuring an open circuit voltage (OCV) of the battery each time the SOC changes, in response to the SOC being included in the diagnosis section.

The obtaining may include changing an amount of current input into the battery to be less than or equal to a threshold, in response to the SOC being included in the diagnosis section.

The obtaining may include obtaining a change in the voltage of the battery with respect to a change in the SOC by outputting a current less than or equal to a threshold from the battery, in response to the SOC being included in the diagnosis section.

The determining may include extracting an SOC that maximizes a variance in the voltage with respect to a variance in the SOC from within the diagnosis section, and estimating the SOH of the battery based on a relationship between the extracted SOC and the SOH.

The determining may include extracting an SOC that maximizes a variance in the voltage with respect to a variance in a quantity of electric charge of the battery from within the diagnosis section, and estimating the SOH of the battery based on a relationship between the extracted SOC and the SOH.

The determining may include determining the SOH based on a voltage of the battery that causes a phase transition in a cathode of the battery.

The battery monitoring method may further include changing an electrochemical thermal model that models an inner state of the battery based on a voltage of the battery that causes a phase transition in a cathode of the battery.

The changing may include calculating a quantity range in which a material included in the battery is to be received in each of an anode of the battery and the cathode of the battery, based on the voltage of the battery that causes the phase transition, and changing the electrochemical thermal model based on a change in the calculated range.

The method may further include changing the diagnosis section based on the determined SOH.

In another general aspect, a non-transitory computer-readable storage medium stores instructions that, when executed by a processor, cause the processor to perform the method described above.

In another general aspect, a battery monitoring method includes identifying a state of charge (SOC) of a battery being charged by inputting a current into the battery, tracking a voltage of the battery while adjusting the current input into the battery, in response to the identified SOC being greater than or equal to a threshold, and determining a state of health (SOH) of the battery based on the voltage of the battery.

The tracking may include measuring an open circuit voltage (OCV) of the battery for each SOC, by blocking the current input into the battery, each time the SOC, while being greater than or equal to the threshold, increases by an interval.

The determining comprises extracting an SOC that maximizes a variance in the voltage of the battery from the SOC, while the SOC is greater than or equal to the threshold, and estimating the SOH of the battery based on a relationship between the extracted SOC and the SOH.

The determining may include extracting an SOC that maximizes a variance in the voltage with respect to a variance in a quantity of electric charge of the battery from the SOC, while the SOC is greater than or equal to the threshold, and estimating the SOH of the battery based on a relationship between the extracted SOC and the SOH.

The determining may include determining the SOH based on a voltage of the battery that causes a phase transition in a cathode of the battery.

The battery monitoring method may further include changing an electrochemical thermal model that models an inner state of the battery based on a voltage of the battery that causes a phase transition in a cathode of the battery.

In another general aspect, a non-transitory computer-readable storage medium stores instructions that, when executed by a processor, cause the processor to perform the method described above.

In another general aspect, a battery monitoring apparatus includes a processor configured to identify a state of charge (SOC) of a battery, and a memory configured to store a parameter related to an electrochemical thermal model that models a chemical reaction in the battery, the electrochemical thermal model to be used to identify the SOC, wherein the processor is further configured to obtain a voltage of the battery with respect to the SOC, in response to the identified SOC being included in a diagnosis section, determine a state of health (SOH) of the battery based on the obtained voltage of the battery, and change the parameter related to the electrochemical thermal model based on the determined SOH.

The processor may be further configured to detect a voltage that causes a phase transition of an active material of a cathode of the battery, based on a relationship between the SOC and the voltage, to determine the SOH.

The processor may be further configured to change the diagnosis section based on the determined SOH.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
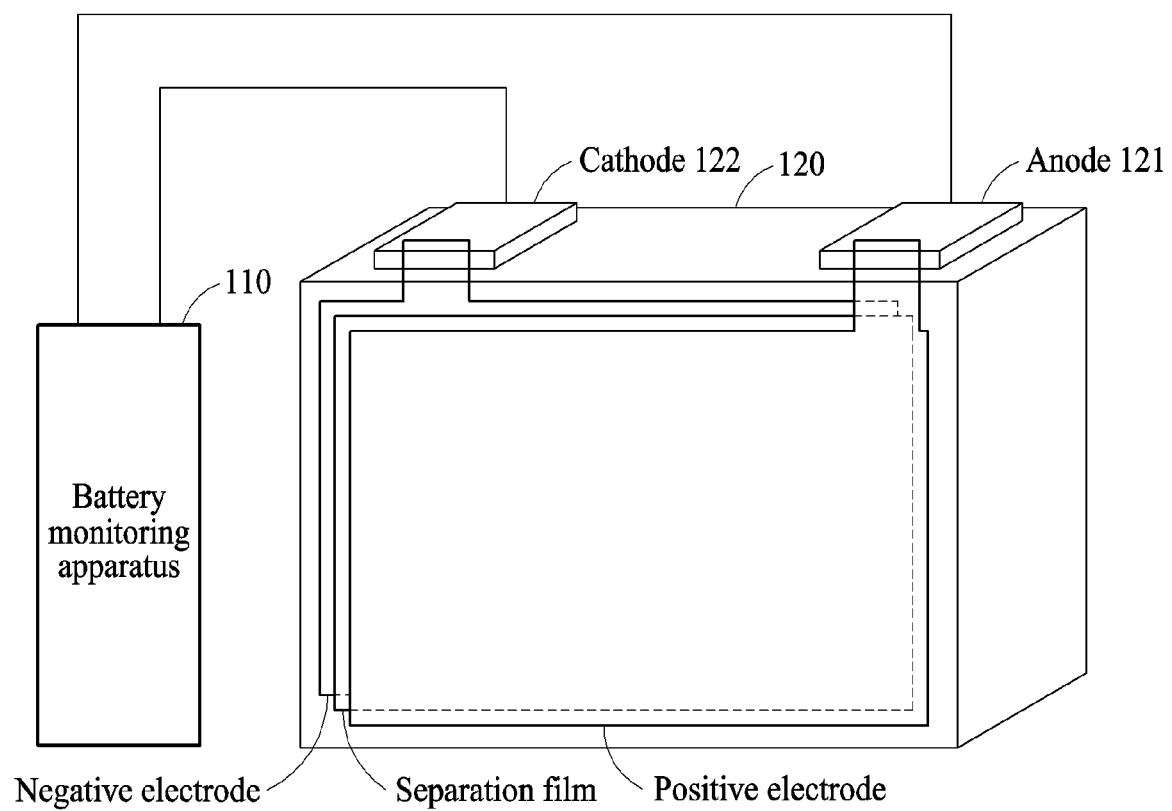
FIG. 1 illustrates an example of a structure of a battery system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

Unless otherwise defined herein, all terms used herein including technical or scientific terms have the same meanings as those generally understood by one of ordinary skill in the art after an understanding of the disclosure of the present application. Terms defined in dictionaries generally used should be construed to have meanings matching with contextual meanings in the related art and the disclosure of the present application and are not to be construed as an ideal or excessively formal meaning unless otherwise defined herein.

Examples set forth hereinafter may be implemented as, or representative of, any of various types of products such as a personal computer, a laptop computer, a tablet computer, a smart phone, a television, a smart home appliance, an intelligent vehicle, a kiosk, and a wearable device. For example, the examples may be applied to, or include, a smart phone, a mobile device, or a smart home system. The examples may be applied to, or include, a payment service through user authentication. Further, the examples may be applied to, or include, an intelligent vehicle system that automatically starts. Hereinafter, the examples will be described in detail with reference to the accompanying drawings, wherein like drawing reference numerals are used for like elements.

FIG. 1 illustrates an example of a structure of a battery system 100.

Referring to the example of FIG. 1, the battery system 100 includes a battery monitoring apparatus 110 and a battery 120. The battery 120 is, for example, a battery cell, a battery module, or a battery pack. In general, the battery 120 may refer to a device that generates electrical power as a result of a chemical reaction. The battery 120 includes a condenser or a secondary cell configured to store power as a result of a charging operation. An apparatus including the battery 120 supplies the power produced by the battery to a load using the battery 120 as an energy source. Referring to the example of FIG. 1, an anode 121 and a cathode 122 are illustrated as elements of the battery 120. The anode 121 of the battery 120 is connected to a positive electrode of the battery 120, and the cathode 122 of the battery 120 is connected to a negative electrode of the battery 120. A separation film is disposed between the positive electrode and the negative electrode. An electrolyte is included between the positive electrode and the negative electrode to facilitate the movement of charge. The battery 120 may further include other elements not shown in the example of FIG. 1. That is, the structure of the battery 120 is not limited to that shown in the example of FIG. 1, but may include additional elements for facilitating the operation of the battery 120. The example of FIG. 1 illustrates a structure and a positional relationship of the anode 121, the cathode 122, and the separation film for ease of description. In other examples, the structure and the positional relationship the anode 121, the cathode 122, and the separation film in the battery 120 may vary and/or differ.

In some examples, the battery 120 is one of a lithium ion (Li-ion) battery, a Li-ion polymer battery, a lead storage battery, a nickel-cadmium (NiCd) battery, and a nickel-metal hydride (NiMH) battery. However, other battery 120 technologies are possible, with the caveat that to be suitable for use as the battery 120, the battery 120 must be rechargeable. For example, some batteries in other applications are designed for a single use. However, such batteries begin with a certain amount of stored energy and cannot be recharged after discharging such energy. Hereinafter, while examples are provided with the battery 120 being a Li-ion battery or a Li-ion polymer battery, and that the anode 121 and the cathode 122 of the battery 120 exchange lithium ions (Li+) in order to provide a flow of electrons that manifests as the electrical output of the battery 120, examples are not limited to such Li-ion or Li-ion polymer batteries.

While the battery 120 is discharged, a chemical reaction involving converting chemical energy stored in the battery 120 into electric energy occurs in the battery 120. In further detail, in an example, a chemical reaction of releasing lithium ions (Li+) and electrons (e−) from the cathode 122 occurs at a boundary between the cathode 122 and the electrolyte. The released lithium ions (Li+) pass through the electrolyte and move to a boundary between the anode 121 and the electrolyte. A chemical reaction involving absorbing the lithium ions (Li+) and the counterpart electrons (e−) into the anode 121 occurs at the boundary between the anode 121 and the electrolyte. That is, the lithium ions (Li+) received by the cathode 122 are released from the cathode 122 and then received by the anode 121. The electrons (e−) absorbed into the anode 121 generate a corresponding current to be output to an exterior of the battery 120 for use in driving an electronic device that requires electrical energy for successful operation.

While the battery 120 is being charged, a chemical reaction of converting electric energy received by the battery 120 into stored chemical energy occurs in the battery 120. For example, when the battery 120 is charged, the chemical reactions of the lithium ions (Li+) and the electrons (e−) are performed inversely with respect to the chemical reactions that occur when the battery 120 is discharged. That is, inverse reactions occur and energy is stored as potential energy rather than being produced. In further detail, a chemical reaction of releasing the lithium ions (Li+) and the electrons (e−) from the anode 121 occurs at the boundary between the anode 121 and the electrolyte. The released lithium ions (Li+) pass through the electrolyte and move to the boundary between the cathode 122 and the electrolyte. Subsequently, a chemical reaction of absorbing the lithium ions (Li+) and the electrons (e−) in the cathode 122 occurs on the boundary between the cathode 122 and the electrolyte. Driving such a chemical reaction requires energy, and forcing it to occur allows storage of such energy by causing the battery to store a larger amount of potential energy.

That is, the lithium ions (Li+) received in the anode 121 are released from the anode 121 and then received at the cathode 122. For example, the cathode 122 includes graphite for use as an active material. During a time period occurring while the lithium ions (Li+) are received in the cathode 122, a phase transition of the graphite occurs, based on a quantity of the lithium ions (Li+) received at the cathode 122. The phase transition of the graphite, that is, the active material of the cathode 122, affects a voltage of the battery 120. During the operation of the battery 120, the phase transition of the active material of the cathode 122 occurs at a point in time at which the quantity of the lithium ions (Li+) received in the cathode 122 is about ¼, ²⁄₄ or ¾ of a maximum quantity of lithium ions (Li+) to be received in the cathode 122, depending on the design of the battery 120 in various examples.

As non-limiting examples, a current input into the battery 120 is expressed in a unit of amperes (A) or milliamperes (mA). A charging current is also expressed as a C-rate. The C-rate indicates a battery related characteristic showing a charging and discharging rate of current with respect to a battery capacity indicating the amount of energy the battery 120 is capable of storing at a point in time. In general, a unit of [C] is used. The C-rate is based on the amount of energy stored in the battery and an intended charging and discharging current. For example, in an example in which a capacity of a battery corresponding to an amount of current to be used for an hour is 1000 milliamperes-hour (mAh), and a charging and discharging current is 1 A, the C-rate is 1 C=1 A/1000 mAh.

Referring to the example of FIG. 1, the battery system 100 includes the battery monitoring apparatus 110 that monitors an inner state of the battery 120 being charged, where the battery is discussed, further, above. The battery monitoring apparatus 110 is implemented by a battery management system (BMS). Such a BMS is a system that manages the battery 120, and performs, for example, any one or any combination of any two or more of an operation of monitoring a state of the battery 120, an operation of maintaining an optimized condition of the battery 120, an operation of predicting a time to replace the battery 120, an operation of detecting a problem of the battery 120, and an operation of controlling the state or an operation of the battery 120 by generating a control or instruction signal related to the battery 120.

Accordingly, the battery monitoring apparatus 110 estimates a state of health (SOH) of the battery 120 based on a state of charge (SOC) and a voltage of the battery 120. The SOC is a parameter indicating a charge level of the battery 120. The SOC indicates an amount of energy stored in the battery 120, and the amount is indicated as 0% to 100%. For example, 0% indicates a fully discharged state and 100% indicates a fully charged state. SOC is directed, specifically, to the total amount of potential energy present in the battery that is able to be used to generate a current. Such a metric is variously modified in varied examples, for example, defined depending on a design intention or an aspect of such examples. The SOC is estimated or measured using various schemes.

By contrast, the SOH is a figure characterizing the merit of the battery 120. That is, the SOH of the battery 120 is a parameter indicating a performance of the battery 120 in a current condition compared to a performance of the battery 120 in an ideal or original condition. Accordingly, the SOH quantitatively indicates a change in a lifetime operational characteristic of the battery 120 caused by an aging effect or degradation of the battery 120. An example of a factor potentially affecting SOH is battery memory due to repeated charging, where progressive partial charges and discharging affects the health of the battery 120. The SOH is expressed using a value between 0% and 100%. For example, in a case in which the performance of the battery 120 in the current condition is equal to the performance of the battery 120 in the ideal or original condition, where there has been no aging or degradation, the SOH of the battery 120 is expressed as being 100%. As the battery 120 is repeatedly charged or discharged for use, the SOH of the battery 120 gradually decreases. The SOH is used as a criterion for indicating a degradation level of a life or a capacity of the battery 120. The SOH is a useful measure because it allows planning for battery degradation and facilitates replacement of batteries whose performance is deemed unacceptable based on a predetermined SOH threshold, for example.

As described above, the anode 121 and the cathode 122 of the battery 120 exchange lithium ions (Li+). That is, the anode 121 and the cathode 122 receive the lithium ions (Li+), depending on whether the battery 120 is being charged or discharged. Thus, the lithium ions (Li+) received in the anode 121 and the cathode 122 are released or received as the battery 120 is charged or discharged. The capacity of the battery 120, that is, a maximum quantity of electric charge to be stored in the battery 120, is determined based on a quantity of lithium ions (Li+) to be received in the anode 121 and the cathode 122.

In further detail, the capacity of the battery 120 is determined to fall within an overlapping range between a range of a quantity of lithium ions (Li+) to be received in the anode 121 and a range of a quantity of lithium ions (Li+) to be received in the cathode 122. For example, while the battery 120 is charged, the lithium ions (Li+) received in the anode 121 are released from the anode 121 and then received in the cathode 122. In such an example, if lithium ions (Li+) are not released any further from the anode 121, although the cathode 122 is capable of receiving more lithium ions (Li+), the battery 120 does not store electric charge any more, in that no further lithium ions (Li+) are available to contribute to the battery 120 storage capacity.

In another example, while the battery 120 is discharged, the lithium ions (Li+) received in the cathode 122 are released from the cathode 122 and then received in the anode 121. In this example, if lithium ions (Li+) are not released any more from the cathode 122, although the anode 121 is capable of receiving more lithium ions (Li+), the battery 120 does not output a current any more. That is, to operate the battery 120, lithium ions (Li+) corresponding to a quantity of lithium ions (Li+) to be received in the anode 121 need to be released from the cathode 122. Otherwise, for example, in an example in which the lithium ions (Li+) of the cathode 122 are exhausted, the battery 120 does not output a current although the anode 121 is capable of receiving much more lithium ions (Li+). In this example, the battery 120 does not operate, because there are no longer any lithium ions (Li+) resident at the cathode 122 capable of being released and serving as a source of electrical energy.

The quantity of lithium ions to be received in the anode 121 and the cathode 122 is equal to a quantity of electric charge to be received in the anode 121 and the cathode 122. The equality of these quantities results from conservation of charge, in that each lithium ion must correspond to a corresponding electron. When designing the battery 120, a quantity of electric charge to be received in the cathode 122 is designed to be about 1.1 times greater than a quantity of electric charge to be received in the anode 121, leading to a stable operation of the battery 120. At a point in time at which the battery 120 is used for the first time, that is, at a point in time at which the SOH of the battery 120 is 100% as there has been no degradation. Accordingly, a range of the quantity of electric charge to be received in the anode 121 and a range of the quantity of electric charge to be received in the cathode 122 overlap in a way such that the capacity of the battery 120 is maximized. For example, a charge balance between the anode 121 and the cathode 122 refers to a comparative relationship between the range of the quantity of electric charge to be received in the anode 121 and the range of the quantity of electric charge to be received in the cathode 122. Accordingly, the battery 120 is usable in an overlapping region between the ranges of use of the anode 121 and the cathode 122, and thus the capacity of the battery 120 changes as the charge balance changes based on limitations on where the overlapping region occurs.

As the battery 120 is repeatedly charged and/or discharged for use, the charge balance between the anode 121 and the cathode 122 progressively deteriorates and degrades. For example, the discharging and recharging are not perfect, and progressively lead to problems with respect to how the battery 120 operates. In further detail, as the battery 120 is repeatedly charged and discharged, the lithium ions released from the anode 121 when charging the battery 120 are not all received in the cathode 122 and a portion of the released lithium ions generate a solid electrolyte interface (SEI) in the cathode 122. Such a chemical reaction of generating an SEI is a side reaction related to a chemical reaction of causing an exchange between chemical energy and electric energy. The side reaction exhausts an electric charge of the battery 120, compromising performance of the battery 120. The side reaction causes a change in the active material of the cathode 122 and the anode 121, for example, melting or irreversible deformation of the active material. Such a change diminishes the health of the battery 120.

While the side reaction continues and the battery 120 is discharged, only a portion of the lithium ions released from the anode 121 and moved to the cathode 122 when charging the battery 120 return to the anode 121. Thus, the lithium ions received in the anode 121 are not all used in order to operate the battery 120. As the battery 120 is used, a quantity of lithium ions successfully used to operate the battery 120 decreases, which leads to a decrease in the capacity of the battery 120. Thus, when the charge balance between the anode 121 and the cathode 122 changes due to the side reaction, as described above, the range of the quantity of electric charge to be received in the anode 121 does not all contribute to the capacity of the battery 120. Such a phenomenon affects a degradation of the battery 120.

In order to assess the SOH of the battery 120, the battery monitoring apparatus 110 estimates a change in the range of the quantity of electric charge to be received in the anode 121 and a change in the range of the quantity of electric charge to be received in the cathode 122 caused by the degradation of the battery 120. Furthermore, the battery monitoring apparatus 110 determines a degradation level of the battery 120, that is, the SOH of the battery 120, from these estimated changes. The determined SOH of the battery 120 or the estimated changes themselves are utilized to estimate and/or characterize the inner state of the battery 120. Also, the battery monitoring apparatus 110 detects a change in the charge balance between the anode 121 and the cathode 122 based on a voltage of the battery 120. That is, a potential difference between the anode 121 and the cathode 122 in the example of FIG. 1 also provides information for the battery monitoring apparatus 110 to be able to measure the SOH of the battery 120.

Figure 2:
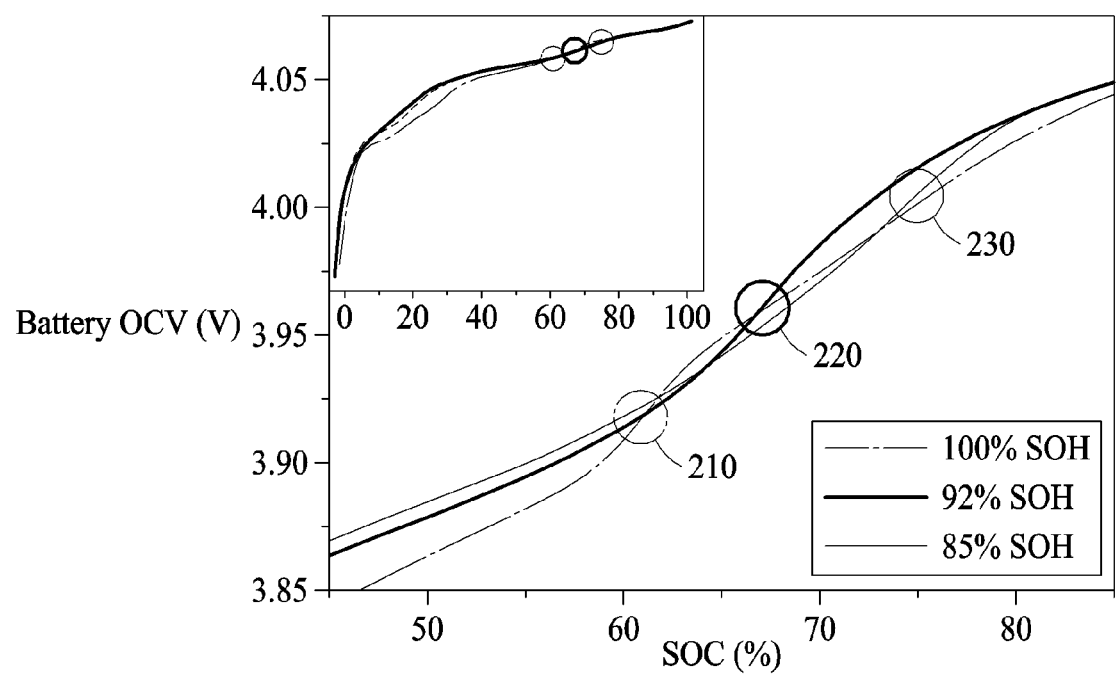
FIG. 2 is a graph illustrating an example of a battery monitoring apparatus detecting a change in a charge balance between an anode and a cathode.

FIG. 2 is a graph illustrating an example of a battery monitoring apparatus for detecting a change in a charge balance between an anode and a cathode. As described above, the charge balance between the anode and the cathode changes in response to a degradation of a battery, such as the degradation of the battery over time.

The discussion of the graph of FIG. 2 refers to elements of a battery monitoring apparatus and a battery. These portions of the graph of FIG. 2 may refer for, example, to corresponding elements presented in the example of FIG. 1, but are not to be limited to the examples presented in the example of FIG. 1.

According to the graph of FIG. 2, a battery monitoring apparatus detects the change in the charge balance between the anode and the cathode based on a change in a range of a quantity of electric charge to be received in the cathode of the battery. Based on a point in time at which a phase transition of an active material, for example, graphite, of the cathode occurs, the battery monitoring apparatus detects the change in the range of the quantity of electric charge to be received in the cathode of the battery. As described above, in an example in which the cathode includes graphite as the active material, the phase transition of the active material of the cathode occurs at a point in time at which a quantity of lithium ions received in the cathode is about ¼, ²⁄₄, or ¾ of a maximum quantity of lithium ions to be received in the cathode.

As a representative example, at a point in time at which the quantity of lithium ions received in the cathode is about ½ of the maximum quantity of lithium ions to be received in the cathode ($LiC_{12}$), the phase transition of the active material of the cathode occurs. The phase transition of the active material of the cathode affects an operating voltage of the battery. Accordingly, the point in time at which the quantity of lithium ions received in the cathode is about ½ of the maximum quantity of lithium ions to be received in the cathode is included in a range of an SOC of the battery from about 50% to 70%. At the point in time at which the phase transition of the active material of the cathode occurs, the voltage of the battery changes to have relatively less sensitivity to a change in the SOC.

As the battery degrades, the range of the quantity of electric charge to be received in the cathode of the battery changes, and the point in time at which the phase transition of the active material of the cathode occurs also changes. Thus, a point in time at which the voltage of the battery changes due to the phase transition of the active material of the cathode also changes over time as the health of the battery becomes progressively worse. Therefore, based on a change in the point in time at which the voltage of the battery changes due to the phase transition of the active material of the cathode, the battery monitoring apparatus determines an SOH of the battery, representative of such a change. Furthermore, based on the change in the point in time at which the voltage of the battery changes due to the phase transition of the active material of the cathode, the battery monitoring apparatus estimates the change in the charge balance between the anode and the cathode, in addition to the range of the quantity of electric charge to be received in the cathode of the battery. As discussed above, these ranges are also highly relevant to measuring the SOH of the battery.

For example, referring to the graph of FIG. 2, changes in an open circuit voltage (OCV) of the battery in response to a change in the SOC of the battery at different SOHs are illustrated. While the battery is being charged, that is, as the SOC of the battery increases, the OCV of the battery also increases. As described above, the point in time at which the phase transition of the active material of the cathode occurs is related to the quantity of lithium ions received in the cathode, and the quantity of lithium ions received in the cathode changes based on the SOC of the battery. Therefore, the phase transition of the active material of the cathode occurs at a predetermined SOC of the battery at which the corresponding quantity of lithium ions is that which also corresponds to the phase change of the active material of the cathode.

As described above, at the point in time at which the phase transition of the active material of the cathode occurs, the voltage of the battery changes to be relatively less sensitive to the change in the SOC. That is, the phase transition of the active material of the cathode occurs so as to maximize a variance in the OCV of the battery with respect to a variance in the SOC of the battery. Referring to the graph of FIG. 2, curves showing relationships between the SOC and the OCV are increasing functions. Thus, points at which the variance in the OCV with respect to the variance in the SOC is maximized correspond to inflection points 210, 220, and 230 of the curves. As indicated in the legend of the graph of FIG. 2, the curves correspond to a relationship between SOC, measured by %, and Battery OCV, measured by V, in situations for 100% SOH, 92% SOH, and 85% SOH.

In a range of the SOC of the battery from about 50% to 70%, the quantity of lithium ions received in the cathode corresponds to about ½ of the maximum quantity of lithium ions to be received in the cathode. The inflection points 210, 220 and 230 indicate points at which the phase transition of the active material of the cathode occurs, because the quantity of lithium ions received in the cathode which corresponds to about ½ of the maximum quantity of lithium ions to be received in the cathode at different SOHs varies. When comparing the inflection points 210, 220 and 230 to determine a trend, it may be seen that an SOC that causes the phase transition of the active material of the cathode increases as the SOH decreases, and hence overall performance of the battery degrades as it cannot provide power as reliably.

In summary, while the battery is being charged, the battery monitoring apparatus obtains the relationship between the SOC and the OCV by measurement. Thus, the battery monitoring apparatus identifies an SOC that maximizes the variance in the OCV with respect to the variance in the SOC from the obtained relationship between the SOC and the OCV. As discussed, such an identified SOC may correspond to an inflection point of a curve, as per the graph of FIG. 2. The battery monitoring apparatus determines the identified SOC to be the SOC that causes the phase transition of the active material of the cathode. As the SOH decreases, the charge balance between the anode and the cathode changes to become progressively less and less favorable for the operation of the battery, and the SOC that causes the phase transition of the active material of the cathode increases in response to the change in the charge balance. Thus, the battery monitoring apparatus determines the SOH of the battery from the determined SOC by analyzing its relationship with OCV measurements.

Figure 3:
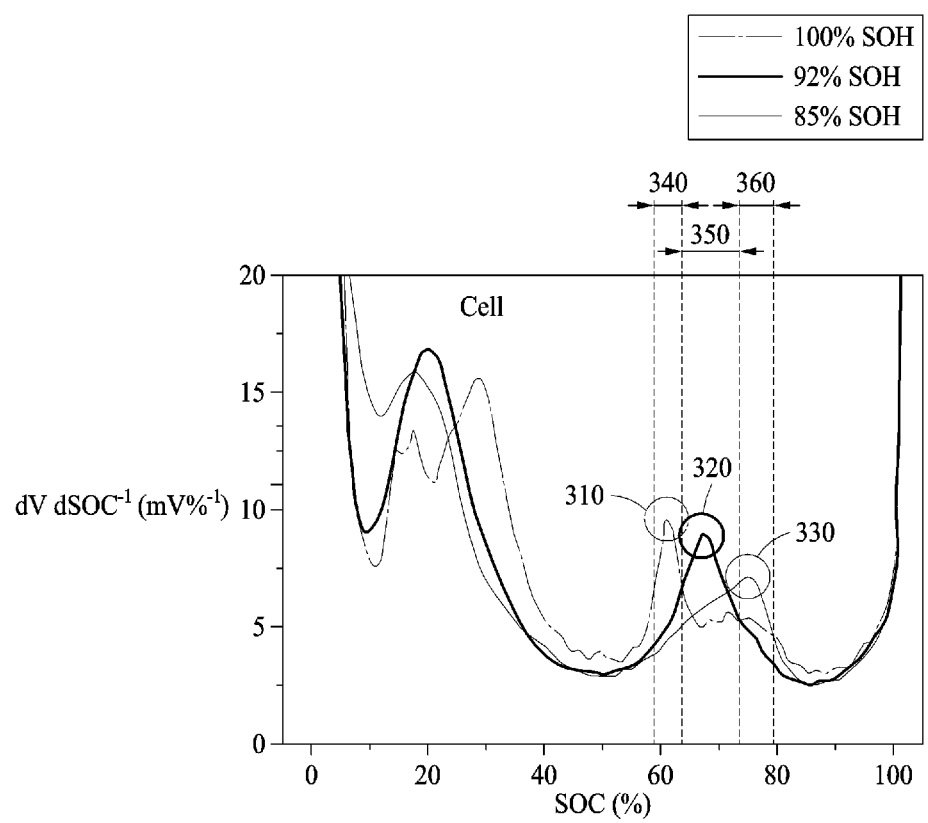
FIG. 3 is a graph illustrating a slope of a relationship between a state of charge (SOC) and an open circuit voltage (OCV) of the example of FIG. 2.

FIG. 3 is a graph illustrating a slope of a relationship between the SOC and the OCV of the graph of FIG. 2. When comparing the graph of FIG. 3 and the graph of FIG. 2, at SOCs that cause the phase transition of the active material of the cathode, the variance in the OCV with respect to the variance in the SOC dV/dSOC, that is, a slope or differential coefficient of the graph of FIG. 2, is maximized. Alternatively, such a slope is referred to as the derivative of the graph of FIG. 2. Such maximum points of a slope or differential coefficients correspond to inflection points of the graph of FIG. 2, because maxima of a slope or differential coefficients occur at points of zero slope on the graph of FIG. 3, which means that the second derivative at the corresponding part of FIG. 2 is zero and there is a corresponding inflection point. Referring to the graph of FIG. 3, peaks of the variance in the OCV with respect to the variance in the SOC, that is, maximum points 310, 320 and 330, are illustrated.

Thus, the maximum points 310, 320 and 330 of the graph of FIG. 3 correspond to the inflection points 210, 220 and 230 of the graph of FIG. 2. That is, the maximum points 310, 320 and 330 correspond to points at which the phase transition of the active material of the cathode occurs. Similar to the description of the graph of FIG. 2, when a charge balance is broken due to a side reaction occurring as the battery is used, SOCs corresponding to the maximum points 310, 320 and 330 increase in response to a degradation of the battery, in accordance with a deterioration of the underlying SOH of the battery. The battery monitoring apparatus determines the SOH of the battery based on the maximum points 310, 320 and 330 of the graph of FIG. 3. That is, the battery monitoring apparatus identifies the SOCs that maximize the variance in the OCV with respect to the variance in the SOC dV/dSOC, which provide for a zero slope of the derivative that corresponds to an inflection point of the original relationship. The battery monitoring apparatus determines the SOH of the battery based on a correlation between the measured change in the charge balance between the anode and the cathode and the measured degradation of the battery.

The battery monitoring apparatus measures the OCV of the battery while increasing the SOC as charging occurs, thereby obtaining the relationship between the SOC and the OCV as shown in the graph of FIG. 2. In some examples, the battery monitoring apparatus differentiates the measured OCV based on the change in the SOC while increasing the SOC, thereby obtaining the differential coefficient of the OCV as shown in the graph of FIG. 3. The OCV of the battery itself is obtained by temporarily suspending charging of the battery. For example, by temporarily setting an amount of current input into the battery to be 0, such as zero amperes, or by temporarily setting the amount of current input into the battery to be less than a preset amount, such as a predetermined threshold, the battery monitoring apparatus measures the OCV of the battery corresponding to a predetermined SOC.

It is potentially helpful to minimize the number of times or a single time used to suspend charging of the battery for measuring OCV values. Accordingly, the battery monitoring apparatus measures the OCV of the battery in a portion of sections of the SOC. Referring to the graph of FIG. 3, diagnosis sections 340, 350 and 360 corresponding to a portion of the sections of the SOC in which the battery monitoring apparatus measures the OCV of the battery are illustrated. Based on the SOC that causes the phase transition of the active material of the cathode to occur and the SOH of the battery and how these metrics change, the battery monitoring apparatus determines or changes the diagnosis sections 340, 350 and 360 accordingly, as needed.

Referring to the graph of FIG. 3, the diagnosis section 340 for the SOH of 100% includes the maximum point 310 for the SOH of 100%, the diagnosis section 350 for the SOH of 92% includes the maximum point 320 for the SOH of 92%, and the diagnosis section 360 for the SOH of 85% includes the maximum point 330 for the SOH of 85%. Thus, the battery monitoring apparatus minimizes the time required for the operation of suspending charging of the battery, and also quickly identifies the SOC that causes the phase transition of the active material of the cathode as an SOC to be used when determining the SOH of the battery.

Figure 4:
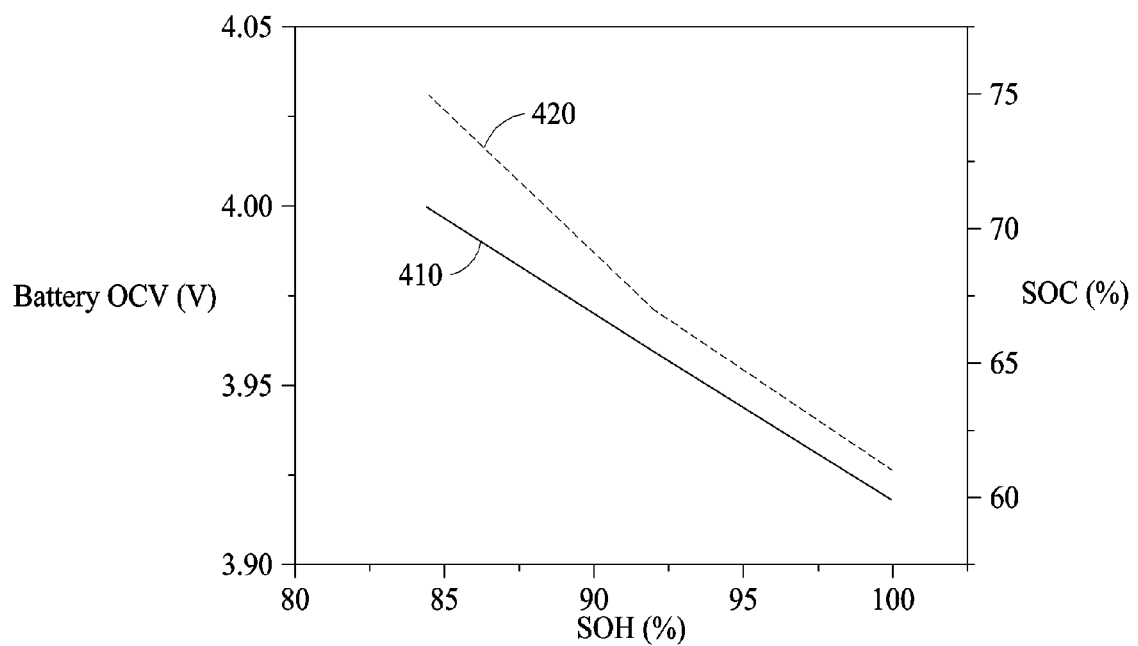
FIG. 4 is a graph illustrating an example of a battery monitoring apparatus determining a state of health (SOH) of a battery from an SOC or an OCV of the battery that causes a phase transition of an active material of a cathode.

FIG. 4 is a graph illustrating an example of how a battery monitoring apparatus determines an SOH of a battery from an SOC or an OCV of the battery that causes a phase transition of an active material of a cathode. Referring to the graph of FIG. 4, a curve 410 showing a relationship between an OCV of a battery that causes a phase transition of an active material of a cathode and an SOH of the battery is illustrated. The curve 410 shows that the OCV that causes the phase transition of the active material of the cathode increases as the SOH of the battery decreases. That is, the OCV that causes the phase transition of the active material of the cathode and the SOH are inversely proportional to one another. In addition, a curve 420 showing a relationship between an SOC of the battery that causes the phase transition of the active material of the cathode and the SOH of the battery is illustrated, for comparison. The curve 420 shows that the SOC that causes the phase transition of the active material of the cathode increases as the SOH of the battery decreases. Thus, similarly to the relationship between the OCV and the SOH, the SOC that causes the phase transition of the active material of the cathode and the SOH are inversely proportional to one another.

A battery monitoring apparatus detects the SOC that causes the phase transition of the active material of the cathode based on the relationship between the SOC of the battery and the OCV of the battery. As described above, considering that a variance in the OCV when compared to a variance in the SOC is maximized at the SOC that causes the phase transition of the active material of the cathode, the battery monitoring apparatus detects the OCV or the SOC that causes the phase transition of the active material of the cathode, using the principles discussed further, above. Accordingly, based on the relationship between the OCV that causes the phase transition of the active material of the cathode and the SOH as shown in the curve 410, the battery monitoring apparatus determines the SOH of the battery by using the model derived as the curve 410. In another example, based on the relationship between the SOC that causes the phase transition of the active material of the cathode and the SOH as shown in the curve 420, the battery monitoring apparatus determines the SOH of the battery by using the model derived as the curve 420.

In some examples, the battery monitoring apparatus determines the SOH of the battery based on a relationship between the OCV and a quantity of electric charge, in addition to the relationship between the OCV and the SOC. Such an approach is based on the observation that when the phase transition of the active material of the cathode occurs, a variance of the OCV of the battery with respect to a variance in the quantity of electric charge accumulated in the battery dV/dQ is maximized. Similar discussions about inflection points to those presented above are relevant to this alternative approach, and are omitted for brevity. Thus, an SOC that maximizes the variance in the OCV with respect to the variance in the quantity of electric charge increases as the battery degrades, as the battery tends to reach capacity while storing a smaller quantity of electric charge.

While the quantity of electric charge increases as the battery is charged, the battery monitoring apparatus obtains the relationship between the quantity of electric charge and the OCV. Similarly to the approaches shown with respect to the graph of FIG. 3, the OCV is measured within a diagnosis section set to correspond to the SOH. By differentiating the obtained relationship between the quantity of electric charge and the OCV, the battery monitoring apparatus tracks the variance in the OCV with respect to the variance in the quantity of electric charge, providing the information for calculating an SOH for the battery. The battery monitoring apparatus identifies the OCV that maximizes the variance in the OCV with respect to the variance in the quantity of electric charge. Based on the relationship between the OCV that causes the phase transition of the active material of the cathode and the SOH as shown in the curve 410 of FIG. 4, the battery monitoring apparatus determines the SOH of the battery.

In another example, the battery monitoring apparatus obtains the relationship between the OCV and the SOC or the relationship between the OCV and the quantity of electric charge, by inputting a current less than or equal to a preset threshold into the battery or outputting the current less than or equal to the preset threshold from the battery. The obtained relationship between the OCV and the SOC or the obtained relationship between the OCV and the quantity of electric charge is then utilized to identify the OCV, the SOC, or the quantity of electric charge that causes the phase transition of the active material of the cathode. From the identified OCV, the identified SOC, or the identified quantity of electric charge that causes the phase transition of the active material of the cathode, the battery monitoring apparatus determines the SOH of the battery accordingly.

The OCV, the SOC or the quantity of electric charge that causes the phase transition of the active material of the cathode is utilized to determine the SOH of the battery, and to more accurately estimate the inner state of the battery. Such an estimation is able to characterize how well the battery is performing and how much the performance of the battery has degraded. In further detail, the battery monitoring apparatus changes an electrochemical thermal model to be used to estimate the inner state of the battery, based on a charge balance between an anode and the cathode determined from the OCV, the SOC, or the quantity of electric charge that causes the phase transition of the active material of the cathode. Such analysis is discussed, further, above. The electrochemical thermal model models the inner state of the battery. In particular, the electrochemical thermal model models a chemical reaction which causes a conversion between a quantity of released or input electric energy and a quantity of stored potential chemical energy in the battery.

Figure 5:
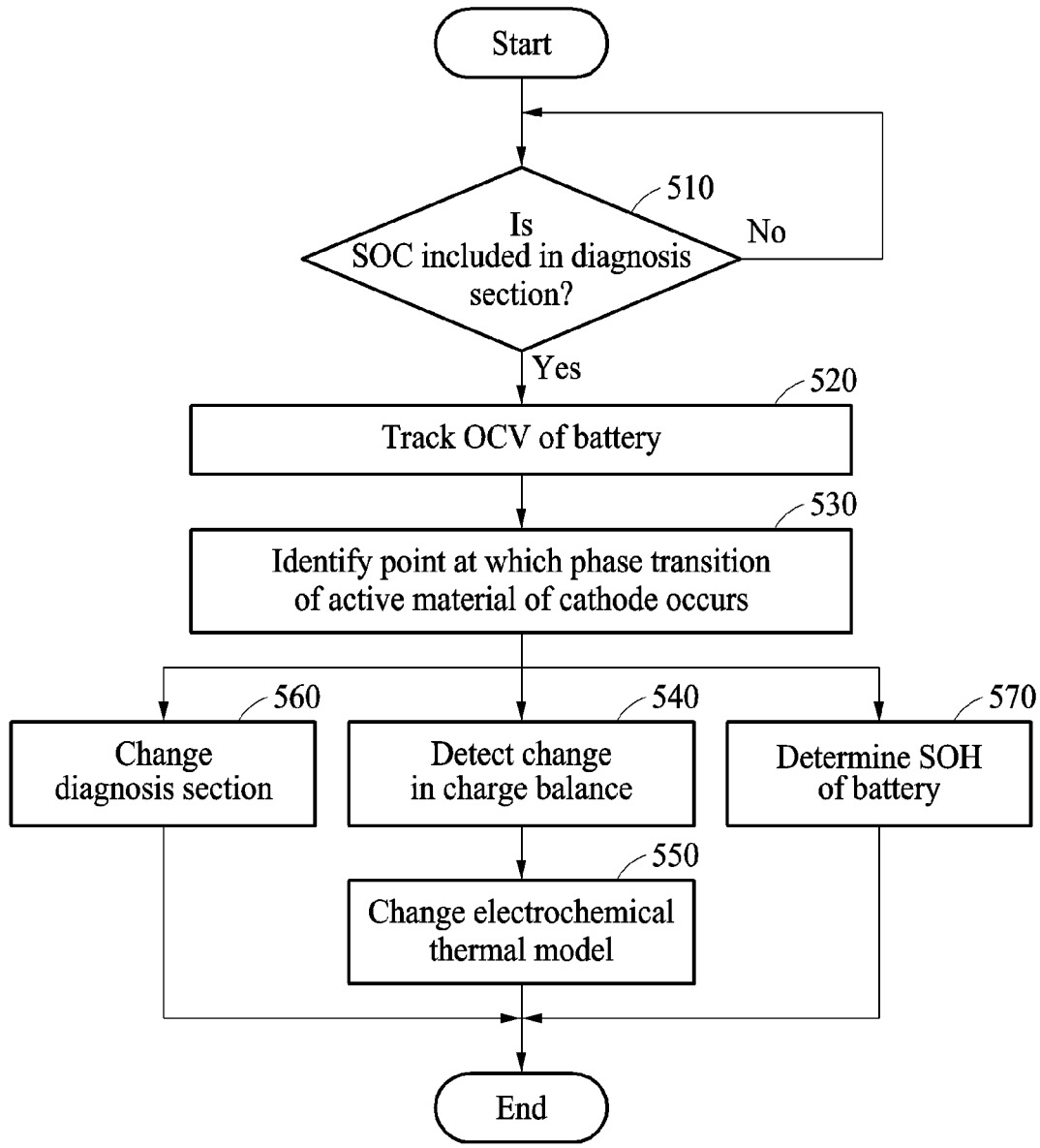
FIG. 5 is a flowchart illustrating an example of an operation of a battery monitoring apparatus.

FIG. 5 is a flowchart illustrating an example of an operation of a battery monitoring apparatus. Such a method performed by the batter monitoring apparatus is an automated and/or automatically performed method performed through using hardware or hardware and software.

Referring to the example of FIG. 5, in operation 510, a battery monitoring apparatus determines whether an SOC of a battery being charged is included in a diagnosis section. The diagnosis section is determined in advance based on an SOH of the battery. As discussed above, the diagnosis section is chosen so that the diagnosis section provides the requisite information while having a minimal effect on the operation of the battery itself. While the battery is being used, the SOC of the battery is tracked in real time using an electrochemical thermal model. Such an electrochemical thermal model is discussed further, above. In an example in which the SOC is greater than or equal to a minimum value of the diagnosis section and less than a maximum value of the diagnosis section, the battery monitoring apparatus determines that the SOC of the battery is included in the diagnosis section.

In response to determination that the SOC of the battery is included in the diagnosis section, the battery monitoring apparatus tracks an OCV of the battery, in operation 520. The battery monitoring apparatus tracks the OCV of the battery by measuring a voltage of the battery while adjusting a current input into the battery. In further detail, each time the SOC increases by a preset interval, the battery monitoring apparatus suspends charging of the battery and then measures the OCV of the battery. For example, charging of the battery is suspended by blocking the current input into the battery. That is, each time the SOC changes, the battery monitoring apparatus measures the OCV of the battery.

In another example, the battery monitoring apparatus measures the OCV of the battery by inputting a current less than or equal to a preset threshold into the battery, also known as low current charging, or by outputting the current less than or equal to the preset threshold from the battery, also known as low current discharging. While tracking the OCV of the battery, the battery monitoring apparatus identifies an SOC of the battery corresponding to the OCV or a quantity of electric charge of the battery corresponding to the OCV. Such information is used for other aspects of monitoring the operations of the battery.

In operation 530, the battery monitoring apparatus identifies a point at which a phase transition of an active material of a cathode occurs based on the tracked OCV of the battery.

As described above, the phase transition of the active material of the cathode occurs based on a quantity of lithium ions to be received in the cathode or a quantity of electric charge of the cathode. That is, the phase transition of the active material of the cathode occurs at a predetermined SOC. Thus, the battery monitoring apparatus identifies a predetermined SOC that causes the phase transition based on a change in the OCV caused by the phase transition. Ways in which the measurements of the OCV are able to be used to identify where the phase transition occurs are discussed further, above, such as by identifying inflection points or differentiating and identifying maximum points.

For example, the battery monitoring apparatus extracts a maximum point of a variance in the OCV with respect to a variance in the SOC from within the diagnosis section. An operation of extracting the maximum point is performed similarly as described with respect to the graphs of FIGS. 2 and 3. The battery monitoring apparatus determines an SOC corresponding to the extracted maximum point to be an SOC at a point in time at which the phase transition occurs. In another example, the battery monitoring apparatus extracts a maximum point of a variance in the quantity of electric charge with respect to the variance in the SOC from within the diagnosis section. As discussed previously, such a maximum point of variance is identifiable as an inflection point. The battery monitoring apparatus determines a quantity of electric charge corresponding to the extracted maximum point to be a quantity of electric charge at the point in time at which the phase transition occurs. Further, the battery monitoring apparatus determines an OCV corresponding to the extracted maximum point to be an OCV at the point in time at which the phase transition occurs.

The SOC, the quantity of electric charge, and the OCV at the point in time the phase transition occurs are related to an SOH of the battery, a range of a quantity of lithium ions to be received in the cathode or the quantity of electric charge, and a charge balance between an anode and the cathode in a defined, predictable manner. Thus, the battery monitoring apparatus determines each of the SOH of the battery, the range of the quantity of lithium ions to be received in the cathode or the quantity of electric charge, and the charge balance between the anode and the cathode based on the identified point in time at which the phase transition occurs. Additional aspects of such a determination are discussed further, above.

In operation 540, the battery monitoring apparatus detects a change in the charge balance of the battery based on the identified point. In further detail, the battery monitoring apparatus determines the range of the quantity of lithium ions to be received in the cathode or the quantity of electric charge based on the SOC that causes the phase transition. As described above, considering that the phase transition of the active material of the cathode occurs at a point in time at which the quantity of lithium ions received in the cathode is about ¼, ²⁄₄, or ¾ of a maximum quantity of lithium ions to be received in the cathode, the battery monitoring apparatus determines a range of the quantity of lithium ions to be received in the cathode from the SOC that causes the phase transition.

Furthermore, based on the SOH, the battery monitoring apparatus determines a range of a quantity of lithium ions to be received in the anode or a quantity of electric charge. The battery monitoring apparatus determines the range of the quantity of lithium ions to be received in the anode or the quantity of electric charge using an electrochemical thermal model. The battery monitoring apparatus identifies the charge balance of the battery by comparing a range of the quantity of lithium ions to be received in the cathode and a range of the quantity of lithium ions to be received in the anode.

In operation 550, the battery monitoring apparatus changes the electrochemical thermal model based on the detected change in the charge balance. The electrochemical thermal model is utilized to estimate a change in an inner state of the battery. For example, such a change in an inner state of the battery may correspond to an SOC of the battery, a change in distribution of lithium ions (Li+) in the battery, or an available battery output. The battery monitoring apparatus stores a parameter related to the electrochemical thermal model in a memory.

Thus, the battery monitoring apparatus changes parameters related to an amount of an active material of the cathode and the anode of the electrochemical thermal model, in response to the change in the charge balance caused by a degradation of the battery. In this manner, the battery monitoring apparatus changes parameters related to the range of the quantity of lithium ions to be received in the anode or the cathode or the quantity of electric charge, in response to a change in the charge balance caused by the degradation of the battery. For example, the battery monitoring apparatus changes parameters to be used to match concentrations of the lithium ions of the anode and the cathode, a maximum quantity and a minimum quantity of available lithium ions, and a maximum concentration and a minimum concentration of lithium ions at the anode or the cathode.

The battery monitoring apparatus obtains information related to the inner state of the battery in real time by inputting and/or incorporating information related to a voltage, a current or a temperature of the battery, measured in real time, into the electrochemical thermal model. By changing the electrochemical thermal model based on the detected change in the charge balance, that is, a change caused by a degradation of the battery, the battery monitoring apparatus obtains more accurate information related to the inner state of the battery from the electrochemical thermal model. Accordingly, the battery monitoring apparatus better reflects the inner state of the battery at a given time.

In operation 560, the battery monitoring apparatus changes the diagnosis section based on the identified point at which the phase transition occurs. For example, the diagnosis section changes such that the SOC that causes the phase transition has a median value with respect to the changed diagnosis section. Based on a variance in the SOC that causes the phase transition, the battery monitoring apparatus changes the diagnosis section accordingly. For example, the battery monitoring apparatus changes the SOC based on an SOH of the battery corresponding to the point in time at which the phase transition occurs.

In operation 570, the battery monitoring apparatus determines the SOH of the battery based on the identified point at which the phase transition occurs. The SOH of the battery is determined based on a relationship between the SOH and one of the SOC, the quantity of electric charge, and the OCV at the point in time at which the phase transition occurs. Examples of such determination have been discussed further, above, and details are omitted for brevity. For example, the battery monitoring apparatus determines the SOH of the battery based on the relationship between the SOH and the OCV at the point in time at which the phase transition occurs as shown in the curve 410 of the graph of FIG. 4. In another example, the battery monitoring apparatus determines the SOH of the battery from the relationship between the SOH and the SOC at the point in time at which the phase transition occurs as shown in the curve 420 of the graph of FIG. 4.

Figure 6:
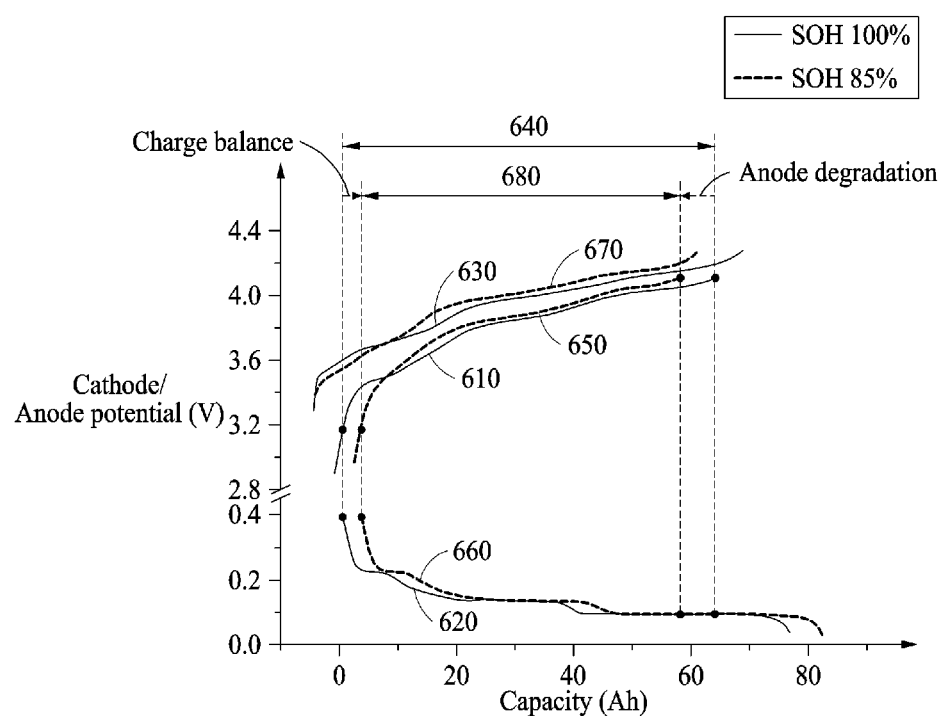
FIG. 6 is a graph illustrating an example of a charge balance of a battery being estimated by a battery monitoring apparatus.

FIG. 6 is a graph illustrating an example of a charge balance of a battery being estimated by a battery monitoring apparatus. Referring to the graph of FIG. 6, in an example in which an SOH of a battery is 100%, a curve 610 showing a change in a cell voltage of the battery with respect to a quantity of electric charge of the battery, a curve 630 showing a change in a potential of an anode of the battery with respect to the quantity of electric charge of the battery, and a curve 620 showing a change in a potential of a cathode of the battery with respect to the quantity of electric charge of the battery are each illustrated. The cell voltage of the battery in this example corresponds to a difference between the potential of the anode and the potential of the cathode, that is, a difference between the curve 630 and the curve 620. Thus, a range 640 of a quantity of electric charge to be stored in the battery is determined based on an overlapping range between the curve 630 and the curve 620 along an axis x.

As described above, the range of the quantity of electric charge to be received in the cathode is possibly wider than the range of the quantity of electric charge to be received in the anode. Thus, the curve 630 is determined based on the range of the quantity of electric charge to be received in the anode. Similarly, the curve 620 is determined based on the range of the quantity of electric charge to be received in the cathode. Furthermore, the range of the quantity of electric charge to be stored in the battery is determined based on the overlapping range between the range of the quantity of electric charge to be received in the anode and the range of the quantity of electric charge to be received in the cathode. In addition, as the battery degrades over time, both a maximum quantity and a minimum quantity of electric charge to be received in the cathode increase accordingly.

Referring to the example of FIG. 6, in an example in which the SOH of the battery is 80%, a curve 650 showing a change in a potential of the cell voltage of the battery with respect to the quantity of electric charge of the battery, a curve 670 showing a change in the potential of the anode of the battery with respect to the quantity of electric charge of the battery, and a curve 660 showing a change in the potential of the cathode of the battery with respect to the quantity of electric charge of the battery are each illustrated. When comparing the curve 660 and the curve 620, it is illustrated that both the maximum quantity and the minimum quantity of electric charge to be received in the cathode increase as the battery degrades, reflecting the deterioration in the performance of the battery.

With respect to the changed SOH, a voltage of the battery still corresponds to the difference between the potential of the anode and the potential of the cathode, that is, the difference between the curve 670 and the curve 660. Thus, a range 680 of the quantity of electric charge to be stored in the battery is determined based on an overlapping range between the curve 670 and the curve 660 on the axis x for the new SOH. When comparing the range 640 of the quantity of electric charge to be stored in the battery for the SOH of 100% and the range 680 of the quantity of electric charge to be stored in the battery for the SOH of 85%, it is seen that a change in the charge balance caused by a change in the range of the quantity of electric charge to be received in the cathode of the battery affects the range of the quantity of electric charge to be stored in the battery.

Thus, the battery monitoring apparatus changes the electrochemical thermal model based on a measured point at which the phase transition of the active material of the cathode occurs. Based on a new electrochemical thermal model derived in such a manner, the battery monitoring apparatus measures changes in the potential of each of the anode and the cathode as shown in the curves 620, 630, 660, and 670. Furthermore, based on the measured changes in the potential of each of the anode and the cathode, the battery monitoring apparatus accurately estimates the SOH of the battery that corresponds to such changes.

Figure 7:
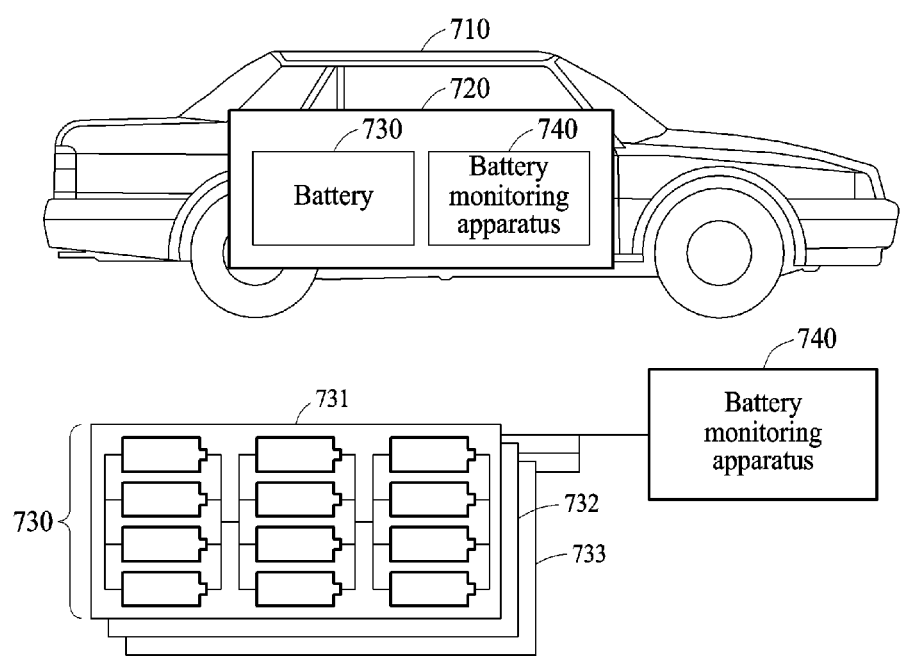
FIG. 7 illustrates an example of a structure of a vehicle including a battery system.

FIG. 7 illustrates an example of a structure of a vehicle 710 including a battery system 720.

Referring to the example of FIG. 7, the vehicle 710 uses a battery 730 as a power source. For example, the vehicle 710 is an electric vehicle or a hybrid vehicle. However, the vehicle 710 is not limited thereto, and may be another type of vehicle that draws all or part of its energy from the battery 730.

The vehicle 710 includes the battery system 720. The battery system 720 includes the battery 730 and a battery monitoring apparatus 740. In the example of FIG. 7, the battery monitoring apparatus 740 is disposed outside of the battery 730. However, in some examples, the battery monitoring apparatus 740 is disposed in the battery 730, and in other examples, some parts of the battery monitoring apparatus 740 are inside of the battery and other parts of the battery monitoring apparatus are outside of the battery.

The battery 730 includes a plurality of battery modules 731, 732 and 733. The plurality of battery modules 731, 732 and 733 each include at least one battery cell. The battery monitoring apparatus 740 stores a parameter for generating an electrochemical thermal model corresponding to the battery cells included in the plurality of battery modules 731, 732 and 733. Because a plurality of battery cells are included in the plurality of battery modules 731, 732 and 733, the parameter for generating the electrochemical thermal model is determined, for example, based on a mean state of the plurality of battery cells or a most degrading battery cell among the plurality of battery cells. However, this is only an example, and the parameter may be based on other measurements of battery state that represent the health of one or some of the plurality of battery cells.

While charging at least one battery cell included in the plurality of battery modules 731, 732 and 733, the battery monitoring apparatus 740 obtains a relationship between an SOC and an OCV of the battery cell being charged. As described above with respect to FIGS. 1-6, the OCV is measured within a diagnosis section. The battery monitoring apparatus 740 identifies an SOC of the battery cell being charged, in particular the SOC that causes a phase transition of an active material of a cathode, from the obtained relationship between the SOC and the OCV. Ways of performing such identification are discussed further, above. From the identified SOC, the battery monitoring apparatus 740 estimates a change in a charge balance or an SOH of the battery cell being charged. The estimated change in the charge balance or the estimated SOH of the battery cell being charged is then used to change the diagnosis section or to change the electrochemical thermal model appropriately.

The battery monitoring apparatuses 110 and 740, and other apparatuses, units, modules, devices, and other components in FIGS. 1 and 7 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIGS. 1-7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A battery monitoring method, comprising:
identifying a state of charge (SOC) of a battery;

obtaining a voltage of the battery with respect to the SOC, in response to the identified SOC being included in a diagnosis section, wherein the diagnosis section is preset based on a prior state of health (SOH) of the battery;

determining a SOH of the battery based on the obtained voltage of the battery; and changing the diagnosis section based on the determined SOH.

2. The battery monitoring method of claim 1, wherein the obtaining comprises measuring an open circuit voltage (OCV) of the battery each time the SOC changes, in response to the SOC being included in the diagnosis section.

3. The battery monitoring method of claim 1, wherein the determining comprises:

extracting an SOC that maximizes a variance in the voltage with respect to a variance in the SOC from within the diagnosis section; and estimating the SOH of the battery based on a relationship between the extracted SOC and the SOH.

4. The battery monitoring method of claim 1, wherein the determining comprises:

extracting an SOC that maximizes a variance in the voltage with respect to a variance in a quantity of electric charge of the battery from within the diagnosis section; and estimating the SOH of the battery based on a relationship between the extracted SOC and the SOH.

5. The battery monitoring method of claim 1, wherein determining comprises determining the SOH based on a voltage of the battery that causes a phase transition in a cathode of the battery.

6. The battery monitoring method of claim 1, further comprising:

changing an electrochemical thermal model that models an inner state of the battery based on a voltage of the battery that causes a phase transition in a cathode of the battery.

7. The battery monitoring method of claim 6, wherein the changing comprises:

calculating a quantity range in which a material included in the battery is to be received in each of an anode of the battery and the cathode of the battery, based on the voltage of the battery that causes the phase transition; and changing the electrochemical thermal model based on a change in the calculated range.

8. The battery monitoring method of claim 1, wherein the obtaining comprises changing an amount of current input into the battery to be less than or equal to a threshold, in response to the SOC being included in the diagnosis section.

9. The battery monitoring method of claim 1, wherein the obtaining comprises obtaining a change in the voltage of the battery with respect to a change in the SOC by outputting a current less than or equal to a threshold from the battery, in response to the SOC being included in the diagnosis section.

10. A battery monitoring method, comprising:

identifying a state of charge (SOC) of a battery;

obtaining a voltage of the battery with respect to the SOC, in response to the identified SOC being included in a diagnosis section, wherein the diagnosis section is preset based on a prior state of health (SOH) of the battery; and determining a SOH of the battery based on the obtained voltage of the battery, wherein the obtaining comprises changing an amount of current input into the battery to be less than or equal to a threshold, in response to the SOC being included in the diagnosis section.

11. A battery monitoring method, comprising:

identifying a state of charge (SOC) of a battery;

obtaining a voltage of the battery with respect to the SOC, in response to the identified SOC being included in a diagnosis section, wherein the diagnosis section is preset based on a prior state of health (SOH) of the battery; and determining a SOH of the battery based on the obtained voltage of the battery, wherein the obtaining comprises obtaining a change in the voltage of the battery with respect to a change in the SOC by outputting a current less than or equal to a threshold from the battery, in response to the SOC being included in the diagnosis section.

12. A battery monitoring method, comprising:

identifying a state of charge (SOC) of a battery being charged by inputting a current into the battery;

tracking a voltage of the battery while adjusting the current input into the battery, in response to the identified SOC being included in a diagnosis section, wherein the diagnosis section is preset based on a prior state of health (SOH) of the battery; and determining a SOH of the battery based on the voltage of the battery, wherein the tracking comprises measuring an open circuit voltage (OCV) of the battery for each SOC, by blocking the current input into the battery, each time the SOC increases by an interval.

13. The battery monitoring method of claim 12, wherein the determining comprises:

extracting an SOC that maximizes a variance in the voltage of the battery from the SOC; and estimating the SOH of the battery based on a relationship between the extracted SOC and the SOH.

14. The battery monitoring method of claim 12, wherein the determining comprises:

extracting an SOC that maximizes a variance in the voltage with respect to a variance in a quantity of electric charge of the battery from the SOC; and estimating the SOH of the battery based on a relationship between the extracted SOC and the SOH.

15. The battery monitoring method of claim 12, wherein the determining comprises determining the SOH based on a voltage of the battery that causes a phase transition in a cathode of the battery.

16. The battery monitoring method of claim 12, further comprising:

changing an electrochemical thermal model that models an inner state of the battery based on a voltage of the battery that causes a phase transition in a cathode of the battery.

17. A battery monitoring apparatus, comprising:

a processor configured to identify a state of charge (SOC) of a battery; and a memory configured to store a parameter related to an electrochemical thermal model that models a chemical reaction in the battery, the electrochemical thermal model to be used to identify the SOC, wherein the processor is further configured to obtain a voltage of the battery with respect to the SOC, in response to the identified SOC being included in a diagnosis section, wherein the diagnosis section is preset based on a prior state of health (SOH) of the battery, determine a SOH of the battery based on the obtained voltage of the battery, change the parameter related to the electrochemical thermal model based on the determined SOH, and change the diagnosis section based on the determined SOH.

18. The battery monitoring apparatus of claim 17, wherein the processor is further configured to detect a voltage that causes a phase transition of an active material of a cathode of the battery, based on a relationship between the SOC and the voltage, to determine the SOH.

* * * * *